US009658106B2

(12) United States Patent
Kobayashi et al.

(10) Patent No.: US 9,658,106 B2
(45) Date of Patent: May 23, 2017

(54) PLASMA PROCESSING APPARATUS AND MEASUREMENT METHOD

(71) Applicant: TOKYO ELECTRON LIMITED, Tokyo (JP)

(72) Inventors: Yuuki Kobayashi, Nirasaki (JP); Hirokazu Ueda, Nirasaki (JP); Kohei Yamashita, Miyagi (JP); Peter L. G. Ventzek, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/700,851

(22) Filed: Apr. 30, 2015

(65) Prior Publication Data

US 2015/0318220 A1 Nov. 5, 2015

Related U.S. Application Data

(60) Provisional application No. 61/988,622, filed on May 5, 2014.

(30) Foreign Application Priority Data

Apr. 2, 2015 (JP) ................................ 2015-075530

(51) Int. Cl.
*G01J 3/443* (2006.01)
*H01L 21/66* (2006.01)
(Continued)

(52) U.S. Cl.
CPC ........... *G01J 3/443* (2013.01); *H01J 37/3171* (2013.01); *H01J 37/32192* (2013.01);
(Continued)

(58) Field of Classification Search
None
See application file for complete search history.

(56) References Cited

U.S. PATENT DOCUMENTS

2004/0036038 A1* 2/2004 Okumura .............. H01J 37/321 250/492.2
2005/0011611 A1* 1/2005 Mahoney .......... H01J 37/32935 156/345.24

(Continued)

FOREIGN PATENT DOCUMENTS

JP 2002-522899 A 7/2002

OTHER PUBLICATIONS

Presentation Material, "Plasma Doping Process Monitoring Diagnostics" presented by 1st Inventor, Yuuki Kobayashi on Nov. 12, 2014 at the American Vacuum Society (AVS) 61st International Symposium & Exhibition held on Nov. 9-14, 2014 in Baltimore, Maryland.

(Continued)

*Primary Examiner* — Kara E Geisel
*Assistant Examiner* — Shawn Decenzo
(74) *Attorney, Agent, or Firm* — Nath, Goldberg & Meyer; Jerald L. Meyer

(57) ABSTRACT

There is provided a plasma processing apparatus, which includes: a processing chamber into which a target substrate is loaded and in which a dopant is implanted into the target substrate using a plasma of a gas which contains an element used as the dopant; a wall probe configured to measure a change in voltage corresponding to a density of charged particles in the plasma generated within the processing chamber; an OES (Optical Emission Spectrometer) configured to measure a light emission intensity of the dopant existing in the plasma; and a calculation unit configured to calculate a dose amount of the dopant implanted into the target substrate, based on a measurement result obtained at the wall probe and a measurement result obtained at the OES.

7 Claims, 9 Drawing Sheets

(51) Int. Cl.

| | |
|---|---|
| ***H01L 21/67*** | (2006.01) |
| ***H01J 37/317*** | (2006.01) |
| ***H01L 21/265*** | (2006.01) |
| ***H01J 37/32*** | (2006.01) |
| ***H01L 21/223*** | (2006.01) |

(52) U.S. Cl.
CPC .. *H01J 37/32412* (2013.01); *H01J 37/32935* (2013.01); *H01J 37/32972* (2013.01); *H01L 21/2236* (2013.01); *H01L 21/265* (2013.01); *H01L 21/67* (2013.01); *H01L 21/67253* (2013.01); *H01L 22/10* (2013.01)

(56) References Cited

U.S. PATENT DOCUMENTS

2005/0158975 A1* 7/2005 Liu .................. H01L 29/42324 438/593
2006/0175010 A1* 8/2006 Puech ............... H01J 37/32935 156/345.15

OTHER PUBLICATIONS

Abstract of Presentation Material uploaded on the AVS website during the 1st week of Jul. 2014 (http://2/ays.org/symposium2014/Papers/Paper_PS1-WeM10.html).

* cited by examiner

| Density [atoms/cm$^3$] (2110) | Voltage change amount [V] (2111) |
|---|---|
| 7.24E+12 | 1.89 |
| 6.83E+12 | 1.76 |
| 6.13E+12 | 1.69 |
| 5.68E+12 | 1.62 |
| ⋮ | ⋮ |

| Parameter (2120) | Value (2121) |
|---|---|
| a | $a_0$ |
| b | $b_0$ |
| c | $c_0$ |
| d | $d_0$ |
| ⋮ | ⋮ |

| Density [atoms/cm$^3$] | Light emission intensity [a.u] |
|---|---|
| 4.82E+12 | 11623 |
| 4.09E+12 | 10925 |
| 3.25E+12 | 8927 |
| 2.41E+12 | 8694 |
| ⋮ | ⋮ |

PLASMA PROCESSING APPARATUS AND MEASUREMENT METHOD

CROSS-REFERENCE TO RELATED APPLICATIONS

This application claims the benefit of U.S. Provisional Application No. 61/988,622, filed on May 5, 2014, in the United States Patent and Trademark Office and Japanese Patent Application No. 2015-075530, filed on Apr. 2, 2015, in the Japan Patent Office, the disclosure of which is incorporated herein in their entirety by reference.

TECHNICAL FIELD

Different aspects and embodiments of the present disclosure relate to a plasma processing apparatus and a measurement method.

BACKGROUND

By implanting a specific element used as a dopant into a semiconductor crystal, a semiconductor having desired electrical properties can be manufactured. Inasmuch as the electrical properties of the semiconductor depend on a dose amount of the dopant, it is important to control the dose amount of the dopant implanted into the semiconductor. As a device for measuring a dose amount of a dopant, there is known, e.g., a Faraday cup.

Further, as examples of a technique for implanting a dopant into a semiconductor crystal, there are known an ion implantation technique and a plasma doping technique. In the plasma doping technique, ions or radicals included in plasma serve as a dopant which acts on a semiconductor crystal.

In case where the dose amount of the dopant is measured using the Faraday cup in the plasma doping technique, a tubular electrode used as a sensor is installed within a processing chamber. If plasma including a depositing gas is generated within the processing chamber, due to the ions or radicals included in the plasma, deposits adhere to the inside of the tubular electrode installed within the processing chamber. Adhesion of insulating deposits to the inside of the electrode reduces a measurement accuracy of the Faraday cup.

Further, in case where deposits adhere to the inside of the tubular electrode, it is difficult for a dry cleaning process to remove the deposits adhering to the inside of the electrode. As such, the electrode is taken out by opening a processing chamber and the deposits adhering to the inside of the electrode is removed by cleaning or other methods. This reduces a throughput when a doping process is performed with respect to a plurality of wafers.

Moreover, if the electrode of the Faraday cup is disposed within the processing chamber, it is sometimes the case that, when plasma is generated within the processing chamber, electric fields are concentrated on the electrode of the Faraday cup, eventually generating an abnormal discharge. If the abnormal discharge is generated, there may be a case where metal elements of the electrode are scattered within the processing chamber, consequently deteriorating characteristics of a device subjected to a doping process.

In addition, while charged particles can be measured using the Faraday cup, it is impossible for the Faraday cup to measure electrically neutral particles such as radicals or the like. For that reason, it is difficult for the Faraday cup to measure a dose amount of a dopant including radicals in the plasma doping technique.

SUMMARY

Some embodiments of the present disclosure provide a plasma processing apparatus and a measurement method, which are capable of measuring a dose amount of a dopant including radicals in a plasma-based doping process.

According to one embodiment of the present disclosure, there is provided a plasma processing apparatus which includes: a processing chamber into which a target substrate is loaded and in which a dopant is implanted into the target substrate using a plasma of a gas which contains an element used as the dopant; a wall probe configured to measure a change in voltage corresponding to a density of charged particles in the plasma generated within the processing chamber; an OES (Optical Emission Spectrometer) configured to measure a light emission intensity of the dopant existing in the plasma; and a calculation unit configured to calculate a dose amount of the dopant implanted into the target substrate, based on a measurement result obtained at the wall probe and a measurement result obtained at the OES.

According to another embodiment of the present disclosure, there is provided a measurement method which includes: implanting a dopant into a target substrate loaded into a processing chamber using a plasma of a gas which contains an element used as the dopant; measuring, by a wall probe, a change in voltage corresponding to a density of charged particles in the plasma generated within the processing chamber; measuring, by an OES (Optical Emission Spectrometer), a light emission intensity of the dopant existing in the plasma; and calculating a dose amount of the dopant implanted into the target substrate based on a measurement result obtained at the wall probe and a measurement result obtained at the OES.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 7 is a view showing one example of a first density table.

FIG. 8 is a view showing one example of a parameter table.

FIG. 10 is a view showing one example of a second density table.

DETAILED DESCRIPTION

Figure 1:
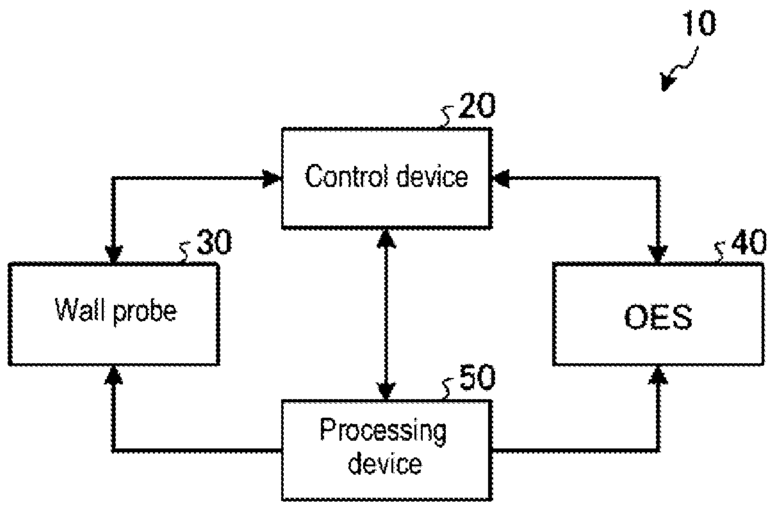
FIG. 1 is a view showing one example of a plasma processing apparatus.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In one embodiment, a plasma processing apparatus disclosed herein includes a processing chamber, a wall probe, an OES (Optical Emission Spectrometer) and a calculation unit. The processing chamber accommodates a target substrate therein. In the processing chamber, a dopant is implanted into the target substrate using plasma of a gas which contains an element used as the dopant. The wall probe measures a change in voltage corresponding to a density of charged particles in the plasma generated within the processing chamber. The OES measures light emission intensity of the dopant existing in the plasma. The calculation unit calculates a dose amount of the dopant implanted into the target substrate, based on a measurement result obtained at the wall probe and a measurement result obtained at the OES.

In one embodiment of the plasma processing apparatus disclosed herein, if the density of the charged particles corresponding to the change in voltage measured at the wall probe falls within a predetermined range, the calculation unit may calculate the dose amount based on the measurement result obtained at the OES.

In one embodiment, the plasma processing apparatus disclosed herein may further include a cleaning instruction unit which is configured to instruct cleaning of the processing chamber if the density of the charged particles corresponding to the change in voltage measured at the wall probe falls within the predetermined range and if the light emission intensity of the dopant measured at the OES is smaller than a first threshold value.

In one embodiment, the plasma processing apparatus disclosed herein may further include a cleaning instruction unit which is configured to calculate the density of the charged particles in the plasma based on the light emission intensity measured at the OES for each type of particles included in the dopant existing in the plasma, and is configured to instruct cleaning of the processing chamber if a difference between the calculated density of the charged particles and the density of the charged particles corresponding to the change in voltage measured at the wall probe is equal to or larger than a second threshold value.

In one embodiment of the plasma processing apparatus disclosed herein, the calculation unit may correct the measurement result obtained at the OES, using the measurement result obtained at the wall probe.

In one embodiment, a measurement method disclosed herein includes a first process, a second process, a third process and a fourth process. The first process includes loading a target substrate within a processing chamber and implanting a dopant into the target substrate using plasma of a gas which contains an element used as the dopant. The second process includes measuring a change in voltage corresponding to a density of charged particles in the plasma generated within the processing chamber using a wall probe. The third process includes measuring light emission intensity of the dopant existing in the plasma using an OES. The fourth process includes calculating a dose amount of the dopant implanted into the target substrate based on a measurement result obtained at the wall probe and a measurement result obtained at the OES.

A plasma processing apparatus and a measurement method according to some embodiments of the present disclosure will now be described in detail with reference to the drawings. However, the present disclosure is not limited to embodiments described below. The respective embodiments may be appropriately combined unless a conflict arises in the process content.

[First Embodiment]

FIG. 1 is a view showing one example of a plasma processing apparatus 10. For example, as shown in FIG. 1, the plasma processing apparatus 10 includes a control device 20, a wall probe 30, an OES 40 and a processing device 50.

The processing device 50 includes a processing chamber. A wafer as a target substrate is disposed within the processing chamber. Responsive to a control signal supplied from the control device 20, the processing device 50 implants a dopant into a wafer, using plasma of a gas which contains an element used as the dopant. Further, the processing device 50 performs cleaning of the inside of the processing chamber in response to a control signal supplied from the control device 20.

The wall probe 30 is connected to an electrode installed within the processing chamber. Responsive to a control signal supplied from the control device 20, the wall probe 30 successively measures, at predetermined respective timings, a change in voltage of the electrode corresponding to a density of charged particles in the plasma generated within the processing chamber of the processing device 50. In this embodiment, the term "a change in voltage" refers to a change amount per unit time of the voltage of the electrode installed within the processing chamber. The wall probe 30 sends a measurement result to the control device 20.

Responsive to a control signal supplied from the control device 20, the OES 40 successively measures, at predetermined respective timings, an intensity of light emitted from each element existing in the plasma generated within the processing chamber of the processing device 50. In a doping process using the plasma, an element of the dopant is included in the plasma. An emission intensity of the element of the dopant existing in the plasma is measured at the OES 40. The OES 40 sends a measurement result to the control device 20.

The control device 20 controls the processing device 50 to perform a doping process in which a dopant is implanted into the wafer disposed within the processing chamber. Further, the control device 20 controls the wall probe 30 to measure the change in voltage corresponding to the density of the charged particles in the plasma generated within the processing chamber of the processing device 50. Moreover, the control device 20 controls the OES 40 to measure the light emission intensity of the element existing in the plasma generated within the processing chamber of the processing device 50. Further, the control device 20 calculates a dose amount of the dopant implanted into the wafer based on the measurement result obtained at the wall probe 30 and the measurement result obtained at the OES 40.

Based on the measurement result obtained at the wall probe 30 and the measurement result obtained at the OES 40, the control device 20 determines whether to perform a cleaning process. If it is determined that the cleaning process is to be performed, the control device 20 instructs the processing device 50 to perform the cleaning process.

[Configuration of Processing Device 50]

Figure 2:
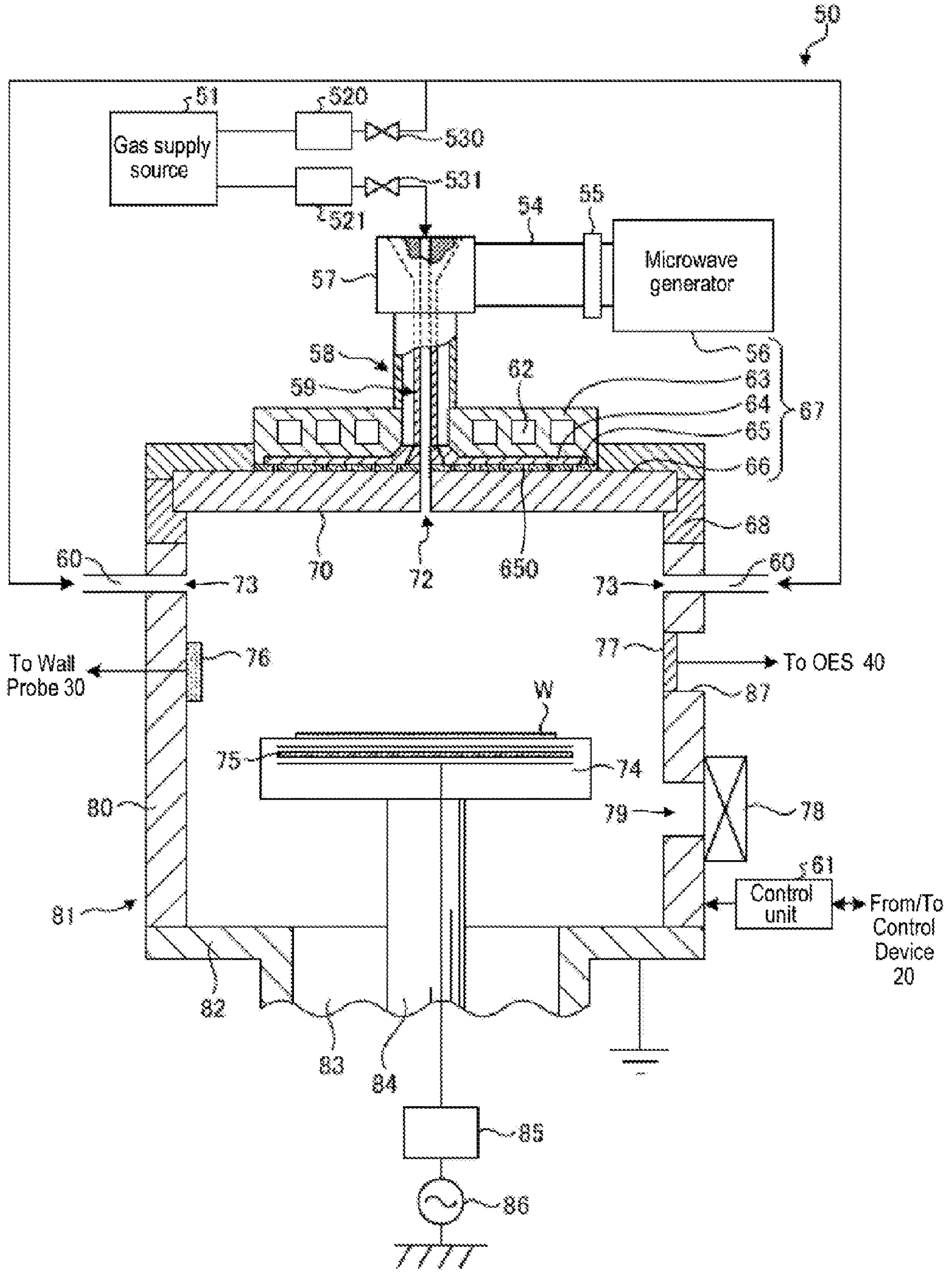
FIG. 2 is a sectional view showing one example of a processing device.
Figure 3:
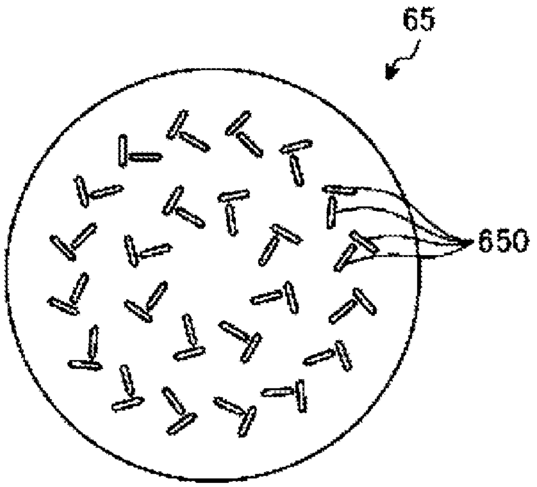
FIG. 3 is a view showing one example of a slot antenna plate.

FIG. 2 is a sectional view showing one example of the processing device 50. FIG. 3 is a view showing one example of a slot antenna plate 65 installed in the processing device 50 shown in FIG. 2. In FIG. 2, for the sake of easier understanding, some of parts are omitted. A description will now be made under the assumption that the up-down direction in FIG. 2 is the up-down direction of the processing device 50.

As shown in FIG. 2, the processing device 50 includes a processing chamber 81 within which a plasma-based doping process is performed with respect to a wafer W loaded into the processing chamber 81. In a peripheral side and an upper side of the processing chamber 81, there are formed a gas supply port 72 and a plurality of gas supply ports 73 through which a plasma-exciting inert gas, a doping gas used as a basis of a dopant implanted into the wafer W and a gas used in cleaning the inside of the processing chamber 81 are supplied into the processing chamber 81. Further, a holding stand 74 on which the wafer W is mounted is installed within the processing chamber 81. In the upper side of the processing chamber 81, there is installed a plasma generating mechanism 67 which generates plasma within the processing chamber 81 using microwaves. In a lower side of the processing chamber 81, there is installed a pressure regulating mechanism (not shown) which regulates an internal pressure of the processing chamber 81.

The processing device 50 further includes a control unit 61 which controls the overall operation of the processing device 50. The control unit 61 makes communication with the control device 20 and controls the processing device 50 based on different kinds of parameters received from the control device 20. Specifically, the control unit 61 executes control operations which include controlling flow rates of the gases supplied from the gas supply port 72 and the gas supply ports 73 into the processing chamber 81, controlling the internal pressure of the processing chamber 81, controlling the plasma generating mechanism 67, and the like.

The processing chamber 81 includes a bottom portion 82 positioned below the holding stand 74 and a substantially cylindrical side wall 80 extending upward from an outer periphery of the bottom portion 82. The sidewall 80 and the bottom portion 82 are made of, e.g., aluminum whose surface is covered with an anodic oxide film, and are grounded. An exhaust port 83 is formed in the bottom portion 82 of the processing chamber 81 so as to penetrate a portion of the bottom portion 82. The upper side of the processing chamber 81 is opened. The processing chamber 81 is configured to be hermetically sealed by a lid part 68 disposed at the upper side of the processing chamber 81, a dielectric window 66 (which will be described later), and a seal member (e.g., an O-ring) interposed between the dielectric window 66 and the lid part 68.

Through the gas supply port 72, a gas is injected from the upper side of the processing chamber 81 toward the wafer W mounted on the holding stand 74. The gas supply port 72 is formed at the substantially center of the dielectric window 66 in a radial direction, and is formed to penetrate inward through the dielectric window 66 from the lower surface 70 of the dielectric window 66 facing the holding stand 74. The gas supply ports 73 are formed in the sidewall 80 of the processing chamber 81 and are configured to horizontally inject a gas from the sidewall 80 toward the wafer W mounted on the holding stand 74.

The gas supply port 72 is coupled to a gas supply source 51 which is configured to supply the plasma-exciting inert gas, the doping gas and the cleaning gas via a series of a gas supply path 59, a valve 531 and a flow rate controller 521. A flow rate of the gas supplied from the gas supply source 51 is adjusted by the flow rate controller 521. Then, the gas is injected from the gas supply port 72 into the processing chamber 81 via the valve 531 and the gas supply path 59.

Each of the gas supply ports 73 is coupled to the gas supply source 51 via a gas supply path 60, a valve 530 and a flow rate controller 520. The flow rate of the gas supplied from the gas supply source 51 is adjusted by the flow rate controller 520. Then, the gas flows through the valve 530 and the gas supply path 60 and is injected from the respective gas supply ports 73 formed in the sidewall 80 of the processing chamber 81 into the processing chamber 81. In some embodiments, the flow rate of the gas injected from the gas supply port 72 may be equal to or may differ from the flow rate of the gas injected from each of the gas supply ports 73. In addition, the type of the gas injected from the gas supply port 72 and the type of the gas injected from each of the gas supply ports 73 may differ from each other. Further, the flow rate ratio of the gas injected from the gas supply port 72 and the flow rate ratio of the gas injected from each of the gas supply ports 73 may differ from each other.

An electrode is installed within the holding stand 74. The electrode is coupled to a high-frequency power supply source 86 (which is used for a radio frequency (RF) bias) via a matching circuit 85. The high-frequency power supply source 86 outputs a high-frequency power of, e.g., 13.56 MHz. The matching circuit 85 is provided with a matching unit configured to match an impedance at the side of the high-frequency power supply source 86 with an impedance at the side of loads mainly composed of the electrode, the plasma and the processing chamber 81. The matcher includes a self-bias-generating blocking capacitor. During the doping process, the application of a bias voltage to the holding stand 74 may be or may not be performed depending on the necessity.

The holding stand 74 is configured to suck and hold the mounted wafer W with an electrostatic chuck (not shown). Further, a heater 75 is installed within the holding stand 74. The wafer W can be heated by the heater 75. The holding stand 74 is supported by a tubular support member 84 extending vertically upward from the lower side of the bottom portion 82. The support member 84 is made of, e.g., an insulating material. The exhaust port 83 is annularly formed along the outer periphery of the support member 84 so as to penetrate a portion of the bottom portion 82 of the processing chamber 81. A lower side of the exhaust port 83 is coupled to an exhaust device (not shown) via an exhaust pipe (not shown). The exhaust device includes a vacuum pump such as a turbo molecular pump. The interior of the processing chamber 81 can be depressurized to a predetermined pressure by the exhaust device. The control unit 61 controls an exhaust operation of the exhaust device as a pressure regulating mechanism such that the internal pressure of the processing chamber 81 is regulated.

The plasma generating mechanism 67 includes a microwave generator 56, a cooling jacket 63, a dielectric member 64, the slot antenna plate 65 and the dielectric window 66. The microwave generator 56 is installed outside the processing chamber 81 and is configured to generate plasma-exciting microwaves. A frequency of the microwaves generated by the microwave generator 56 is, e.g., 2.45 GHz. The microwaves generated by the microwave generator 56 propagate to a mode converter 57 via a matching part 55 and a waveguide 54. The mode converter 57 converts the microwaves of, e.g., a TE mode, generated by the microwave generator 56 into the microwaves of a TEM mode. A coaxial waveguide 58 propagates the microwaves, which are mode-converted by the mode converter 57, to the dielectric member 64. The microwaves propagated to the dielectric member 64 via the coaxial waveguide 58 propagate toward an outer side of the dielectric member 64 in a radial direction and also propagate to the slot antenna plate 65 installed below the dielectric member 64.

The slot antenna plate 65 is formed in a substantially disc-like shape by metal or the like. For example, as shown in FIG. 3, a plurality of slot holes 650 is formed in the slot antenna plate 65. The slot holes 650 are formed such that, for example, as shown in FIG. 3, pairs of the slot holes 650 orthogonal to each other are disposed at a predetermined interval. The pairs of the slot holes 650 are disposed at a predetermined interval along the circumferential direction of the slot antenna plate 65. Even in the radial direction of the slot antenna plate 65, the pairs of the slot holes 650 are disposed at a predetermined interval along a plurality of concentric circles having different radii.

The microwaves propagated from the dielectric member 64 to the slot antenna plate 65 propagate to the dielectric window 66 installed below the slot antenna plate 65 through the slot holes 650 formed in the slot antenna plate 65. Subsequently, the microwaves propagated from the slot antenna plate 65 to the dielectric window 66 are radiated into the processing chamber 81 through the lower surface 70 of the dielectric window 66. The dielectric window 66 is formed in a substantially disc-like shape by, e.g., a dielectric material such as quartz or alumina.

The cooling jacket 63 is installed on an upper surface of the dielectric member 64. A circulation path 62 for circulating a coolant therethrough is formed within the cooling jacket 63. The coolant flows through the circulation path 62 so that the cooling jacket 63 can cool the dielectric member 64, the slot antenna plate 65 and the dielectric window 66.

An electrode 76 is installed in the sidewall 80 of the processing chamber 81. The electrode 76 is connected to the wall probe 30. A surface of the electrode 76 is coated with, e.g., yttrium oxide ($Y_2O_3$) or the like. An insulating member 760 (see FIG. 4) is installed between the electrode 76 and the sidewall 80 such that the electrode 76 and the sidewall 80 are electrically insulated from each other.

An opening 87 is formed in the sidewall 80 of the processing chamber 81. A window 7 made of quartz or the like is installed in the opening 87. Light emitted from the elements of ions or radicals existing in the plasma generated within the processing chamber 81 is received by the OES 40 through the window 77.

An opening 79 is formed in the sidewall 80 of the processing chamber 81. A gate valve 78 is installed in the opening 79. In case of carrying the wafer W into the processing chamber 81, the support member 84 moves the holding stand 74 down to the height of the opening 79 under the control of the control unit 61. Then, the gate valve 78 is opened. The wafer w is carried into the processing chamber 81 through the opening 79 by a transfer device such as a robot arm or the like and is mounted on the holding stand 74. Under the control of the control unit 61, the gate valve 78 is closed and the holding stand 74 is moved up to a specified height by the support member 84. Subsequently, the doping process is performed with respect to the wafer W mounted on the holding stand 74.

Upon completion of the doping process for the wafer W mounted on the holding stand 74, the support member 84 moves the holding stand 74 down to the height of the opening 79 under the control of the control unit 61. Then, the gate valve 78 is opened and the wafer W mounted on the holding stand 74 is carried out by the transfer device such as the robot arm.

According to the configuration described above, the processing device 50 supplies the plasma-exciting inert gas, the doping gas and the like into the processing chamber 81 through the gas supply port 72 and the gas supply ports 73. The internal pressure of the processing chamber 81 is controlled to a predetermined pressure. Thereafter, the microwaves are radiated from the lower surface 70 of the dielectric window 66 into the processing chamber 81 by the plasma generating mechanism 67. Thus, the processing device 50 generates plasma within the processing chamber 81. Then, the processing device 50 performs the doping process, the cleaning process or the like with respect to the wafer W using the generated plasma.

The plasma generated within the processing chamber 81 forms a so-called plasma generation region having a relatively high electron temperature, in an area just below the lower surface 70 of the dielectric window 66, specifically spaced at about several centimeters from the lower surface 70 of the dielectric window 66. In an area positioned below the plasma generation region, there is formed a so-called plasma diffusion region where the plasma generated in the plasma generation region is diffused. The plasma diffusion region is a region where the electron temperature of the plasma is kept relatively low. The plasma-based doping process is performed in the plasma diffusion region. This makes it possible to alleviate the damage caused to the wafer W by the plasma in the doping process. Since an electron density of the plasma is relatively high in the plasma diffusion region, it is possible to efficiently perform the plasma-based doping process, specifically to shorten a period of time required in the plasma-based doping process.

[Configuration of Wall Probe 30]

Figure 4:
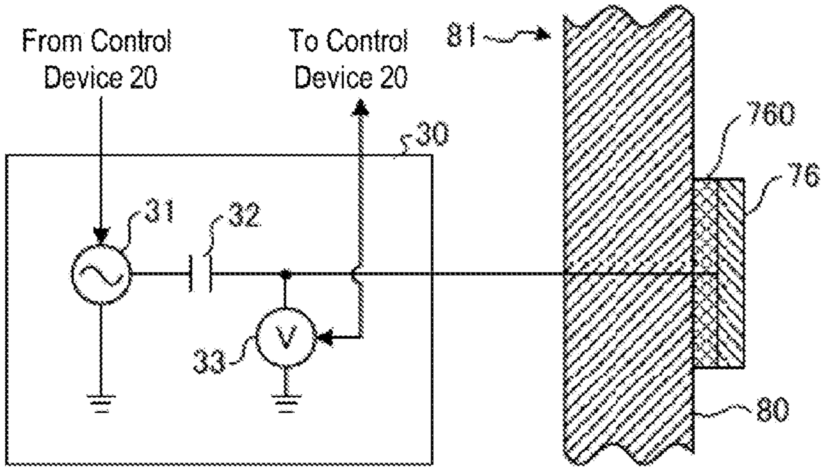
FIG. 4 is a block diagram showing one example of a wall probe.

FIG. 4 is a block diagram showing one example of the wall probe 30. The wall probe 30 includes a signal generator 31, a capacitor 32 and a voltage measuring unit 33. One end of the capacitor 32 is connected to the signal generator 31. The other end of the capacitor 32 is connected to the electrode 76 via the sidewall 80 of the processing chamber 81 and the insulating member 760. Further, the other end of the capacitor 32 is connected to the voltage measuring unit 33.

Based on a control signal indicative of the measurement start provided from the control device 20, the signal generator 31 outputs an AC signal of a predetermined frequency to the capacitor 32. Further, upon receiving a control signal indicative of the measurement stop from the control device 20, the signal generator 31 stops the output of the AC signal.

Upon receiving a control signal indicative of the measurement start from the control device 20, the voltage measuring unit 33 starts to measure a change amount per unit time of a voltage of the electrode 76 and outputs the successively-measured values of the voltage change amount to the control device 20. Further, upon receiving a control signal indicative of the measurement stop from the control device 20, the voltage measuring unit 33 stops the measurement of the change amount of the voltage of the electrode 76.

In this regard, the flux of ions "$\Gamma_{ion}$" in the plasma generated within the processing chamber 81 can be calculated by, e.g., the following formula (1).

$$\Gamma_{ion} = \frac{C}{eS} \times \frac{dV}{dt} \quad (1)$$

In the above formula (1), C is a capacitance of the capacitor 32, e is an elementary charge, S is a surface area of the electrode 76, and dV/dt is the change amount per unit time of the voltage of the electrode 76.

The capacitance of the capacitor 32, the elementary charge and the surface area of the electrode 76 are known values. Therefore, if the change amount per unit time of the voltage of the electrode 76 is measured at the voltage measuring unit 33, the flux of ions $\Gamma_{ion}$ in the plasma generated within the processing chamber 81 can be calculated using the above formula (1). A correlation exists between the flux of ions $\Gamma_{ion}$ in the plasma and the density of the charged particles in the plasma. For that reason, the density of the charged particles in the plasma can be found from the calculation result of the flux of ions $\Gamma_{ion}$ in the plasma.

[Configuration of Control Device 20]

Figure 5:
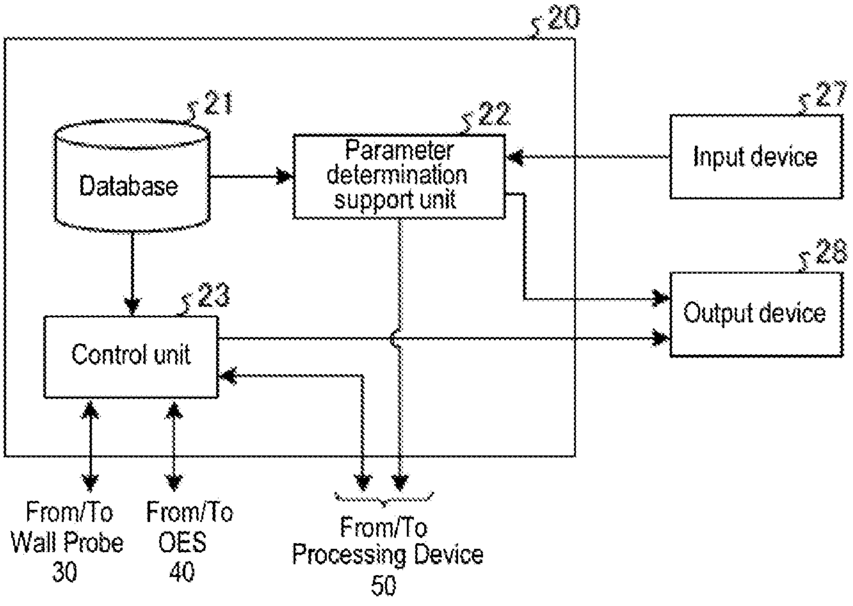
FIG. 5 is a block diagram showing one example of a control device.

FIG. 5 is a block diagram showing one example of the control device 20. For example, as shown in FIG. 5, the control device 20 includes a database 21, a parameter determination support unit 22 and a control unit 23. A dose amount table 210, a first density table 211 and a parameter table 212 (which will be described later) are stored in the database 21.

Figure 6:
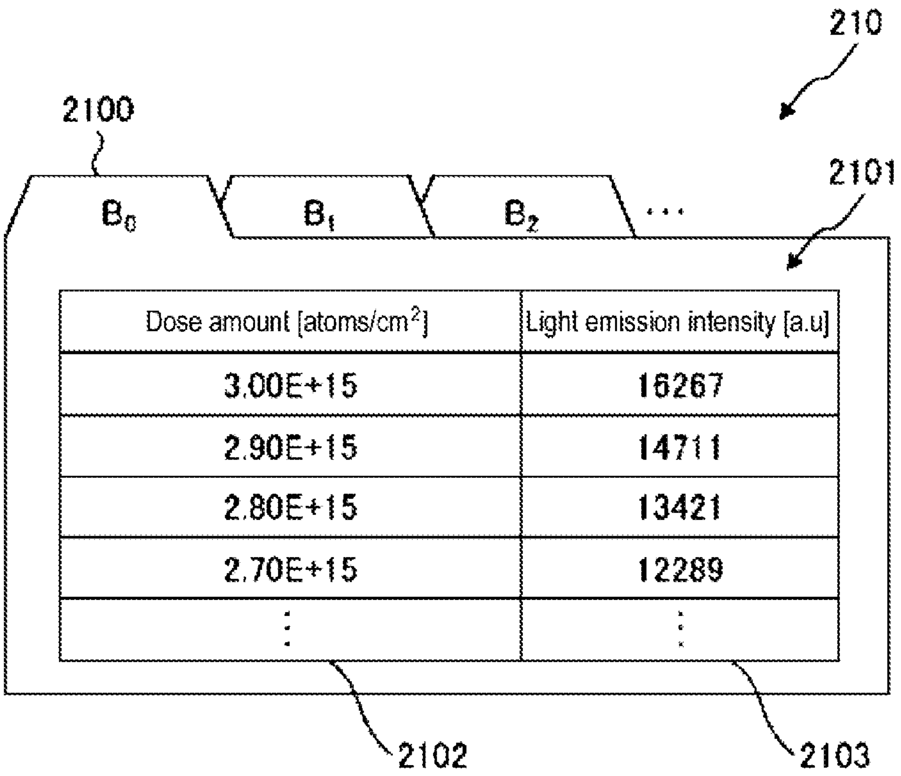
FIG. 6 is a view showing one example of a dose amount table.

FIG. 6 is a view showing one example of a dose amount table 210. In the dose amount table 210, individual tables 2101 are stored for each of dopant types 2100. In the dopant types 2100 illustrated in FIG. 6, "$B_0$" indicates, e.g., electrically neutral boron. "$B_1$" indicates, e.g., a monovalent boron ion. "$B_2$" indicates, e.g., a bivalent boron ion.

In each of the individual tables 2101, respective light emission intensity data 2103 of the elements of the dopants measured at the OES 40 is stored in association with respective dose amount data 2102. The respective data of the respective individual tables 2101 are measured in advance by experiments or the like and are stored in the respective individual tables 2101. By referring to the individual tables 2101 associated with the respective dopant types 2100, it is possible to obtain the dose amount of the dopant whose light emission intensity is measured at the OES 40.

FIG. 7 is a view showing one example of the first density table 211. In the first density table 211, respective change amount data 2111 of the voltage measured at the wall probe 30 are stored in association with respective density data 2110 of the charged particles in the plasma. The respective data of the first density table 211 are measured in advance by experiments or the like and are stored in the first density table 211. By referring to the first density table 211, it is possible to obtain the density of the charged particles in the plasma from the change amount per unit time of the voltage measured at the wall probe 30.

FIG. 8 is a view showing one example of the parameter table 212. In the parameter table 212, respective values 2121 are stored in association with respective parameter data 2120 included in a physical model used in calculating the dose amount. The respective data of the parameter table 212 are stored in advance. By referring to the parameter table 212, it is possible to calculate the dose amount using the physical model.

Referring back to FIG. 5, the parameter determination support unit 22 calculates the dose amount using different kinds of parameters inputted by an operator of the plasma processing apparatus 10 through an input device 27 such as a mouse or a keyboard. The parameter determination support unit 22 calculates the dose amount based on the physical model represented by, e.g., the following formula (2).

$$\text{Dose Amount} = aQ + bP + cP_{MW} + dP_{RF} + eT \quad (2)$$

In the above formula (2), Q is a flow rate of a process gas, P is an internal pressure of the processing chamber 81, $P_{MW}$ is an electric power of microwaves, $P_{RF}$ is an electric power of the high-frequency bias, and T is a process time of the doping process for each of the wafers W. In the above formula (2), a, b, c, d and e are predetermined coefficients.

The parameter determination support unit 22 receives the values of Q, P, $P_{MW}$, $P_{RF}$ and T inputted by the operator through the input device 27, followed by calculating the dose amount from the above formula (2) using the received values, followed by outputting the calculated dose amount to an output device 28 such as a display or the like. While seeing the dose amount outputted to the output device 28, the operator adjusts the values of Q, P, $P_{MW}$, $P_{RF}$ and T using the input device 27 and determines the values of Q, P, $P_{MW}$, $P_{RF}$ and T which constitute a desired dose amount. If the values of Q, P, $P_{MW}$, $P_{RF}$ and T are determined by the operator, the parameter determination support unit 22 instructs the processing device 50 to start the doping process with the determined values of Q, P, $P_{MW}$, $P_{RF}$ and T.

Upon receiving a start signal of the doping process for the wafer W from the processing device 50, the control unit 23 instructs the wall probe 30 and the OES 40 to start measurement. Then, the control unit 23 receives the measurement result of the change amount of the voltage successively transmitted from the wall probe 30. Further, the control unit 23 receives the values of light emission intensities for the respective elements successively transmitted from the OES 40 and holds the received values until an end signal of the doping process for the wafer W is received from the processing device 50.

While the doping process is performed by the processing device 50, the control unit 23 calculates the density of the charged particles corresponding to the measurement result of the change amount of the voltage received from the wall probe 30, with reference to the first density table 211 stored in the database 21. In some embodiments, the control unit 23 may calculate the density of the charged particles corresponding to the measurement result of the change amount of the voltage received from the wall probe 30, for example, by linearly or curvilinearly interpolating the respective data of the density of the charged particles and the change amount of the voltage included in the first density table 211. Then, the control unit 23 determines whether the calculated density of the charged particles falls within a predetermined range. The term "predetermined range" denotes a range of the density of the charged particles in the generated plasma in case where the plasma is normally generated pursuant to a recipe of the doping process.

If the calculated density of the charged particles does not fall within the predetermined range, it is presumed that the plasma is not normally generated within the processing chamber 81 and a certain abnormality is occurring in the processing device 50. In this case, the control unit 23 instructs the processing device 50 to stop the doping process.

Then, the control unit 23 outputs an alarm through the output device 28, thereby notifying the operator of an indication of the abnormality of the doping process.

If the calculated density of the charged particles falls within the predetermined range, the control unit 23 determines whether the measured value of the light emission intensity is equal to or larger than a first predetermined threshold value, based on the measurement result of the light emission intensity for the respective element received from the OES 40.

In this regard, if deposits produced by the plasma generated within the processing chamber 81 adhere to a surface of the window 77, the transmittance of the window 77 is deteriorated so that the light emission intensity measured at the OES 40 decreases. The first threshold value is a lower limit value of a tolerance range of error, in case where the measured value of the light emission intensity measured at the OES 40 is reduced due to the deterioration in the transmittance of the window 77. In this embodiment, the first threshold value is, e.g., light emission intensity corresponding to, e.g., about 95% of the light emission intensity measured at the OES 40 when the doping process is started after the cleaning process.

In some embodiments, an element used in determining whether the measured value of the light emission intensity is equal to or larger than the first threshold value may be a specific element showing a large light emission amount or may be a plurality of elements included in the plasma. If the light emission intensity for the respective element measured at the OES 40 becomes smaller than the first threshold value, the cleaning of the interior of the processing chamber 81 is performed to remove the deposits adhering to the surface of the window 77.

If the density of the charged particles calculated based on the measurement result of the change amount of the voltage received from the wall probe 30 falls within the predetermined range and if the light emission intensity for every element measured at the OES 40 is equal to or larger than the first threshold value, it is presumed that the plasma is normally generated within the processing chamber 81 and further that the deterioration in the transmittance of the window 77 caused by the deposits falls within the tolerance range. In this case, the control unit 23 continues to monitor the density of the charged particles and the light emission intensity for every element. The processing device 50 continuously performs the doping process with respect to the wafer W. Then, if the process time indicative of the parameter T received from the parameter determination support unit 22 is elapsed, the processing device 50 terminates the doping process for the wafer W. Then, the processing device 50 notifies the control unit 23 of the termination of the doping process.

Upon receiving the termination of the doping process for the wafer W from the processing device 50, the control unit 23 instructs the wall probe 30 and the OES 40 to stop the measurement operation. Then, the control unit 23 calculates an average value of the light emission intensity for every element of the dopant, based on the measurement result of the light emission intensity for every element received from the OES 40, while performing the doping process. Further, the control unit 23 specifies individual tables for every element of the dopant by referring to the dose amount table 210 stored in the database 21.

Then, the control unit 23 calculates a dose amount corresponding to the calculated average value of the light emission intensity, for every element of the dopant, by referring to the specified individual tables. Then, the control unit 23 adds up the dose amounts calculated for every element of the dopant using, e.g., the following formula (3), thereby calculating the dose amount of the dopant implanted into the wafer W. Subsequently, the control unit 23 outputs information of the calculated dose amount and identification information of the wafer W subjected to the doping process, to the output device 28, an external server or the like.

$$\text{Dose Amount} = \sum_{k=1}^{n} D_k \tag{3}$$

In the above formula (3), n denotes the number of kinds of elements used as the dopant, and $D_k$ denotes a dose amount of kth kind of dopant.

On the other hand, if the density of the charged particles calculated based on the measurement result of the change amount of the voltage received from the wall probe 30 falls within the predetermined range and if the light emission intensity for every element measured at the OES 40 is smaller than the first threshold value, it is presumed that the plasma is normally generated within the processing chamber 81, while the deterioration in the transmittance of the window 77 caused by the deposits falls outside the tolerance range. In this case, the control unit 23 instructs the processing device 50 to stop the doping process. The processing device 50 carries the wafer W out of the processing chamber 81. Then, the control unit 23 instructs the processing device 50 to perform a cleaning process. The control unit 23 is one example of a cleaning instruction unit. Responsive to the instruction supplied from the control unit 23, the processing device 50 performs the cleaning process. Thus, the deposits adhering to the surface of the window 77 are removed so that the transmittance of the window 77 is restored into the tolerance range.

In the cleaning process performed by the processing device 50, a specific cleaning gas is supplied into the processing chamber 81 and the internal pressure of the processing chamber 81 is regulated to a predetermined pressure, in a state where the wafer W is not loaded into the processing chamber 81. Subsequently, microwaves having a predetermined electric power are radiated from the plasma generating mechanism 67 into the processing chamber 81, whereby the plasma is generated within the processing chamber 81 for a predetermined period of time. Thereafter, the gas existing within the processing chamber 81 is exhausted. Thus, the deposits adhering to the inner wall of the processing chamber 81 and the surface of the window 77 are removed.

More specifically, an $O_2$ gas is supplied into the processing chamber 81 and the internal pressure of the processing chamber 81 is regulated to the predetermined pressure. Then, the microwaves having the specified electric power are radiated from the plasma generating mechanism 67 into the processing chamber 81 so that plasma of the $O_2$ gas is generated within the processing chamber 81 for several tens of seconds. Thereafter, the gas existing within the processing chamber 81 is exhausted. Subsequently, a He gas is supplied into the processing chamber 81 and the internal pressure of the processing chamber 81 is regulated to the predetermined pressure. Then, the microwaves having the specified electric power are radiated from the plasma generating mechanism 67 into the processing chamber 81. Plasma of the He gas is generated within the processing chamber 81 for several tens of seconds. Thereafter, the gas existing within the processing chamber 81 is exhausted. Thus, the cleaning process of the interior of the processing chamber 81 is completed.

After the cleaning process is performed, the control unit 61 performs a pre-coating process of generating plasma within the processing chamber 81 for a predetermined period of time, with the same recipe as the recipe of the doping process, in a state where the wafer W is not loaded into the processing chamber 81. By doing so, the inner wall of the processing chamber 81 is coated with thin deposits. This prevents the deposits newly generated within the processing chamber 81 by the cleaning process from scattering within the processing chamber 81 during the doping process. Upon completion of the pre-coating process, the control unit 61 loads a new wafer W into the processing chamber 81 and resumes the doping process.

[Operation of Plasma Processing Apparatus 10]

Figure 9:
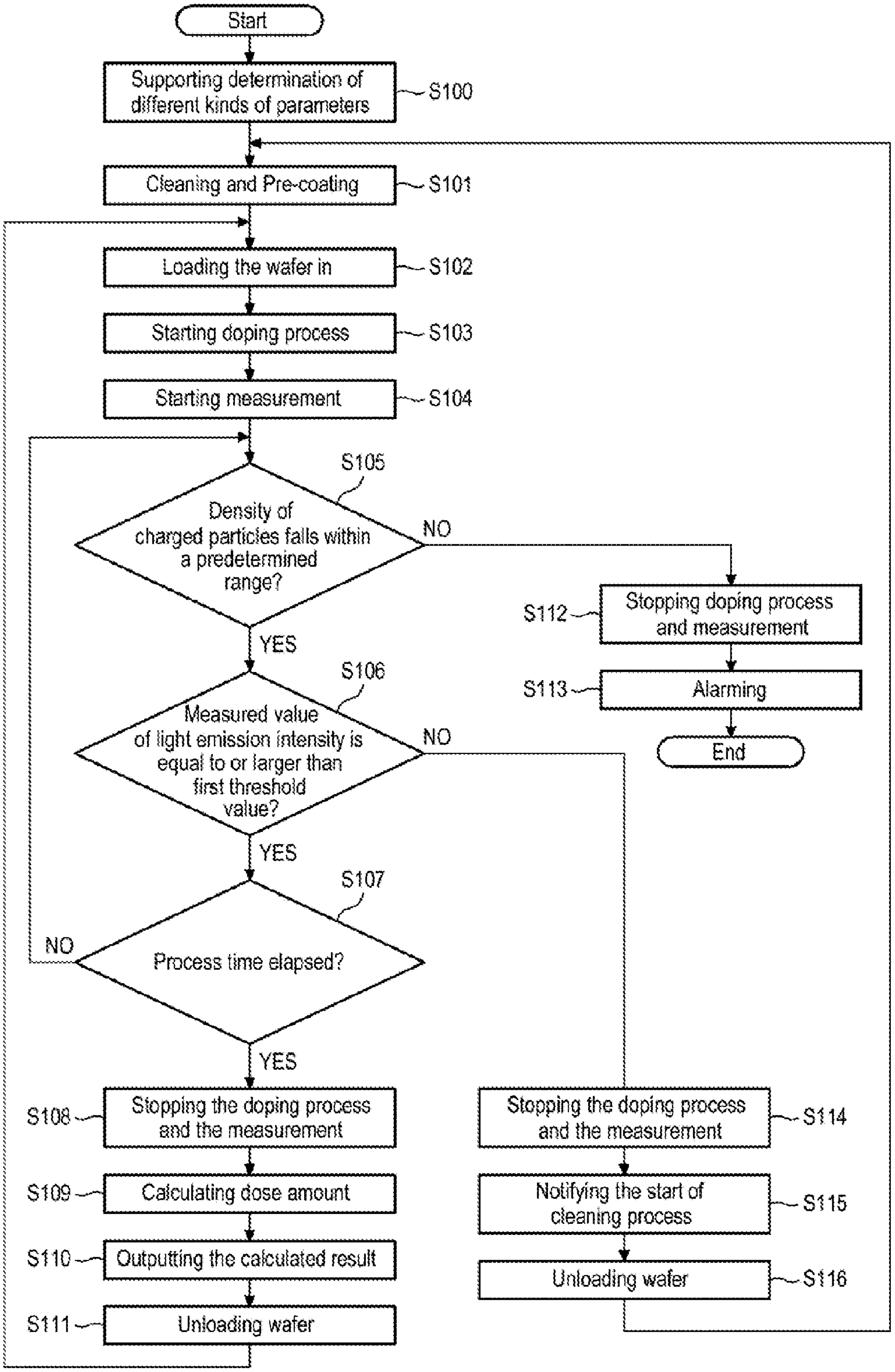
FIG. 9 is a flowchart showing one example of an operation of a plasma processing apparatus according to a first embodiment.

FIG. 9 is a flowchart showing one example of the operation of the plasma processing apparatus 10 according to a first embodiment. The plasma processing apparatus 10 starts operations of the flowchart shown in FIG. 9, for example, in response to a start instruction of the doping process inputted by the operator.

First, the parameter determination support unit 22 of the control device 20 supports determination of various kinds of parameters in the plasma-based doping process (S100). Specifically, the parameter determination support unit 22 calculates the dose amount based on the above formula (2), using the various kinds of parameters inputted by the operator through the input device 27, and outputs the value of the calculated dose amount to the output device 28. While seeing the dose amount outputted to the output device 28, the operator adjusts the values of Q, P, $P_{MW}$, $P_{RF}$ and T through the input device 27 and determines the values of Q, P, $P_{MW}$, $P_{RF}$ and T which can obtain a desired dose amount. Upon determination of the values of Q, P, $P_{MW}$, $P_{RF}$ and T by the operator, the parameter determination support unit 22 instructs the processing device 50 to start the doping process with the values of Q, P, $P_{MW}$, $P_{RF}$ and T thus determined.

Subsequently, the processing device 50 supplies a cleaning gas into the processing chamber 81 and regulates the internal pressure of the processing chamber 81 to a predetermined pressure. Then, the processing device 50 supplies microwaves into the processing chamber 81 such that plasma is generated within the processing chamber 81 for a predetermined period of time, thus performing a cleaning process. Thereafter, the processing device 50 performs the pre-coating process of generating plasma within the processing chamber 81 for a specified time, with the same recipe as the recipe of the doping process, based on the various kinds of parameters notified from the control device 20 (S101).

Subsequently, the processing device 50 opens the gate valve 78. Then, a wafer W is loaded into the processing chamber 81 by a transfer device such as a robot arm or the like and is mounted on the holding stand 74 (S102). Thereafter, the processing device 50 closes the gate valve 78 and drives the support member 84 to move the holding stand 74 up to a specified height. Then, the processing device 50 supplies a plasma-exciting inert gas and a doping gas into the processing chamber 81 and controls the internal pressure of the processing chamber 81 to become a predetermined pressure. Subsequently, the processing device 50 radiates microwaves into the processing chamber 81 and generates plasma within the processing chamber 81, thereby starting the doping process with respect to the wafer W mounted on the holding stand 74 (S103). And, the processing device 50 notifies the control device 20 of the start of the doping process.

Subsequently, the control unit 23 of the control device 20 instructs the wall probe 30 and the OES 40 to start measurement (S104). Then, the control unit 23 receives the measurement result of the change amount of the voltage successively transmitted from the wall probe 30. Further, the control unit 23 receives the measurement result of the light emission intensity for every element successively transmitted from the OES 40 and holds the measurement result thus received.

Subsequently, by referring to the first density table 211 stored in the database 21, the control unit 23 calculates the density of the charged particles corresponding to the measurement result of the change amount of the voltage received from the wall probe 30. Then, the control unit 23 determines whether the calculated density of the charged particles falls within a predetermined range (S105).

If the calculated density of the charged particles does not fall within the predetermined range (NO at S105), the control unit 23 instructs the wall probe 30 and the OES 40 to stop the respective measurement processes and instructs the processing device 50 to stop the doping process. Thus, the wall probe 30 and the OES 40 stop the respective measurement processes and the processing device 50 stops the doping process (S112). Then, the control unit 23 outputs an alarm through the output device 28, thereby notifying the operator of the abnormality of plasma (S113). The processing device 50 terminates the operations shown in the flowchart.

On the other hand, if the calculated density of the charged particles falls within the predetermined range (YES at S105), the control unit 23 determines whether the measured value of the light emission intensity is equal to or larger than a first threshold value, based on the measurement result of the light emission intensity for every element received from the OES 40 (S106). If the measured value of the light emission intensity is equal to or larger than the first threshold value (YES at S106), the control unit 23 continues to monitor the light emission intensity for every element existing in the plasma and the density of the charged particles. Then, the processing device 50 determines whether the process time of the doping process is elapsed (S107). If the process time is not elapsed (NO at S107), the control unit 23 performs the process of step S105 again.

On the other hand, if the process time is elapsed (YES at S107), the processing device 50 stops the doping process and notifies the control device 20 of the termination of the doping process. The control unit 23 of the control device 20 instructs the wall probe 30 and the OES 40 to stop the respective measurement processes. Thus, the wall probe 30 and the OES 40 stop the respective measurement processes (S108). Then, during the doping process, the control unit 23 calculates an average value of the light emission intensity for every element of the dopant, based on the measurement result of the light emission intensity for every element received from the OES 40. Then, the control unit 23 calculates a dose amount for every element of the dopant by referring to the dose amount table 210 stored in the database 21. Then, the control unit 23 adds up the dose amounts calculated for every element of the dopant, thereby calculating the dose amount of the dopant implanted into the wafer W (S109). Then, the control unit 23 outputs the calculation result of the dose amount to the output device 28 or the like (S110).

Subsequently, the processing device 50 drives the support member 84 to move the holding stand 74 down to the height of the opening 79 and opens the gate valve 78. Thereafter, the wafer W mounted on the holding stand 74 is unloaded by the transfer device such as the robot arm or the like (5111). Then, the processing device 50 performs the process of step S102 again.

Further, if the measured value of the light emission intensity for every element received from the OES 40 is smaller than the first threshold value (NO at S106), the control unit 23 instructs the wall probe 30 and the OES 40 to stop the respective measurement processes and instructs the processing device 50 to stop the doping process. Thus, the wall probe 30 and the OES 40 stop the respective measurement processes and the processing device 50 stops the doping process (S114). Then, the control unit 23 notifies the operator of the start of the cleaning process through the output device 28 (S115). Then, the control unit 23 instructs the processing device 50 to perform the cleaning process. The processing device 50 drives the support member 84 to move the holding stand 74 downward and opens the gate valve 78. Thereafter, the wafer W mounted on the holding stand 74 is unloaded by the transfer device such as the robot arm or the like (S116). Then, the processing device 50 performs the process of step S101 again.

The first embodiment has been described above. As is apparent from the foregoing description, according to the plasma processing apparatus 10 of the first embodiment, the dose amount of the dopant including radicals can be measured in the plasma-based doping process.

[Second Embodiment]

A plasma processing apparatus according to a second embodiment differs from the plasma processing apparatus 10 of the first embodiment in that the cleaning process of the processing chamber 81 is performed in case where a difference between the density of the charged particles in the plasma calculated from the measurement result of the OES 40 and the density of the charged particles in the plasma calculated from the measurement result of the wall probe 30 is equal to or larger than a predetermined value. Further, the plasma processing apparatus according to the second embodiment differs from the plasma processing apparatus 10 of the first embodiment in that the measurement result of the OES 40 is corrected based on the measurement result of the wall probe 30.

Except for the points described below, the configurations of the plasma processing apparatus, the control device 20, the wall probe 30, the OES 40 and the processing device 50 according to the second embodiment are identical with the configurations of the plasma processing apparatus 10, the control device 20, the wall probe 30, the OES 40 and the processing device 50 according to the first embodiment, which have been described with reference to FIGS. 1 to 8. No description will be made on the identical configurations.

A dose amount table, a first density table, a parameter table and a second density table are stored in the database 21 according to the second embodiment. FIG. 10 is a view showing one example of a second density table 213. Respective light emission intensity data 2131 of the charged particles in the plasma measured at the OES 40 is stored in the second density table 213 in association with respective density data 2130 of the charged particles in the plasma. The data of the second density table 213 is measured in advance by experiments or the like and are stored in the second density table 213. By referring to the second density table 213, the density of the charged particles in the plasma can be calculated from the measurement result of the light emission intensity of the charged particles measured at the OES 40.

While the doping process is performed by the processing device 50, the control unit 23 calculates the light emission intensity of the charged particles existing in the plasma, using the measurement result of the light emission intensity for every element received from the OES 40. If different kinds of charged particles are included in the plasma, the control unit 23 calculates, as the light emission intensity, a value obtained by adding up the light emission intensities of the respective charged particles. Thereafter, by referring to the second density table 213 stored in the database 21, the control unit 23 calculates the density of the charged particles corresponding to the calculated light emission intensity.

Further, by referring to the first density table 211 stored in the database 21, the control unit 23 calculates the density of the charged particles corresponding to the measurement result of the change amount of the voltage received from the wall probe 30. Subsequently, using the following formula (4), the control unit 23 calculates a difference ΔD between the density $D_o$ of the charged particles calculated based on the measurement result of the OES 40 and the density $D_w$ of the charged particles calculated based on the measurement result of the wall probe 30.

$$\Delta D = D_w - D_o \tag{4}$$

Thereafter, the control unit 23 determines whether the value of the difference ΔD calculated using the above formula (4) is smaller than a second predetermined threshold value. The second predetermined threshold value correspond to a range in which the density of the charged particles calculated based on the measurement result of the OES 40 is permitted as an error in case where the measured value of the light emission intensity measured at the OES 40 is reduced due to the decrease in the transmittance of the window 77. In this embodiment, the second predetermined threshold value corresponds to, e.g., 10% of the density $D_w$ of the charged particles calculated based on the measurement result of the wall probe 30.

If deposits adhere to the surface of the window 77, the transmittance of the window 77 is reduced, thus deteriorating a measurement accuracy of the light emission intensity measured at the OES 40. For that reason, if the deposits are increased, the density $D_o$ of the charged particles calculated based on the measurement result of the OES 40 becomes smaller than the actual density. On the other hand, under the principle of measurement, the wall probe 30 is less susceptible to the deposits adhering to the surface of the electrode 76. For that reason, if the deposits adhering to the inner wall of the processing chamber 81 is increased, the difference between the density $D_o$ of the charged particles calculated based on the measurement result of the OES 40 and the density $D_w$ of the charged particles calculated based on the measurement result of the wall probe 30 becomes larger. In this embodiment, if the difference ΔD between the density $D_o$ of the charged particles calculated based on the measurement result of the OES 40 and the density $D_w$ of the charged particles calculated based on the measurement result of the wall probe 30 is equal to or larger than the second predetermined threshold value, the cleaning process of the interior of the processing chamber 81 is performed to remove the deposits adhering to the surface of the window 77.

Even if the difference ΔD is smaller than the second predetermined threshold value, the doping process is performed so that the deposits adhering to the surface of the window 77 are increased. That is to say, as the doping process is successively performed, the light emission intensity for every element measured at the OES 40 grows smaller than the light emission intensity measured at the start time of the doping process. On the other hand, under the principle of measurement, the wall probe 30 is less susceptible to the deposits adhering to the surface of the electrode 76. For that reason, if the difference ΔD is smaller than the second predetermined threshold value, the control unit 23 corrects the measurement result of the OES 40 using the density $D_o$ of the charged particles calculated based on the measurement result of the OES 40 and the density $D_w$ of the charged particles calculated based on the measurement result of the wall probe 30.

For example, the control unit 23 corrects the measurement result of the OES 40 using the following formula (5).

$$I_i' = \frac{D_W}{D_O} \times I_i \tag{5}$$

In the above formula (5), $I_i$ is a measured value of a light emission intensity of ith kind of dopant measured at the OES 40, and $I_i'$ is the light emission intensity of the ith kind of dopant available after correction.

Subsequently, for every element of the dopant, the control unit 23 calculates the dose amount corresponding to the corrected light emission intensity by referring to the dose amount table 210 stored in the database 21. Thereafter, using the aforementioned formula (3), the control unit 23 calculates the dose amount of the dopant implanted into the wafer W.

[Operation of Plasma Processing Apparatus According to Second Embodiment]

Figure 11:
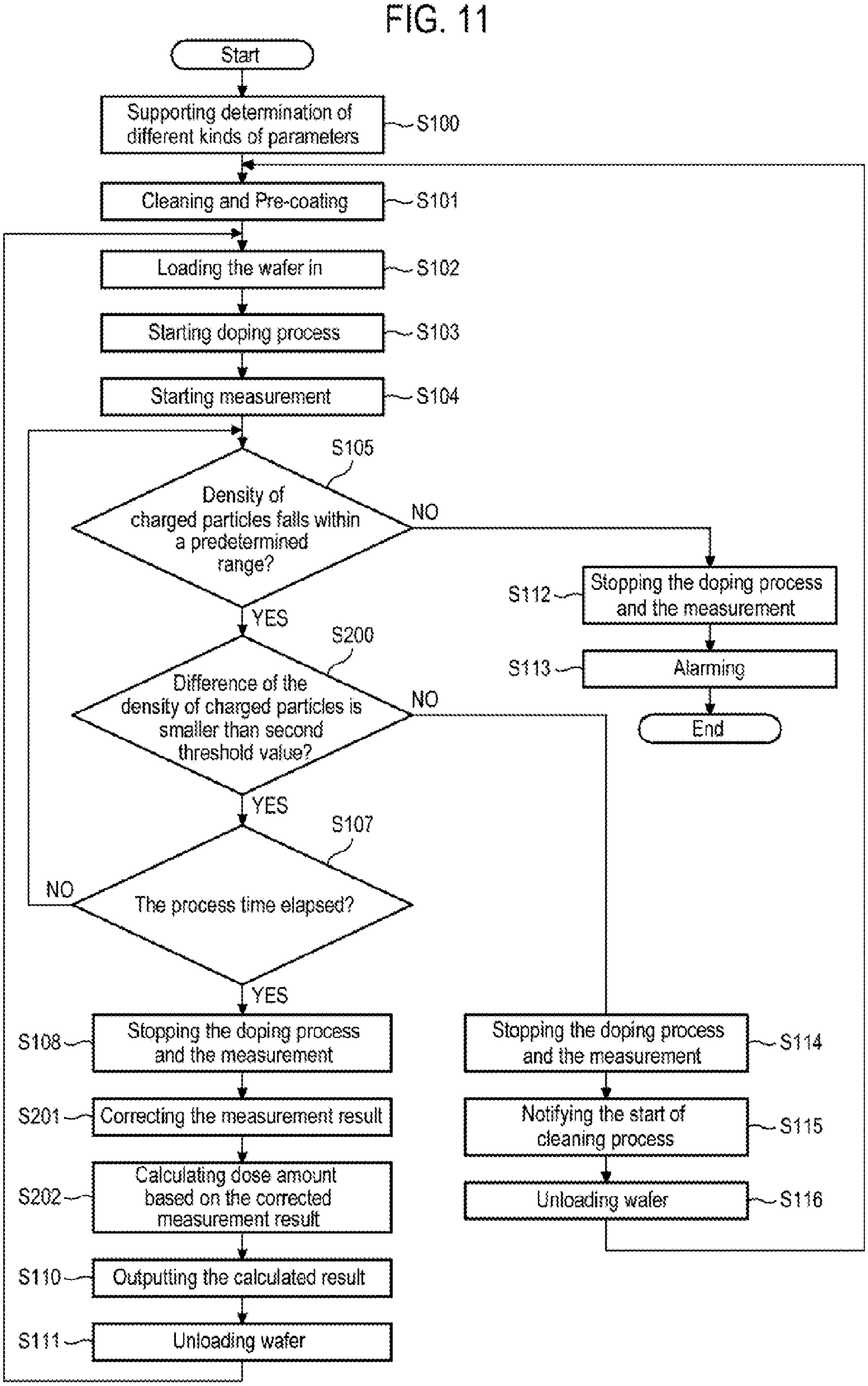
FIG. 11 is a flowchart showing one example of an operation of a plasma processing apparatus according to a second embodiment.

FIG. 11 is a flowchart showing one example of the operation of the plasma processing apparatus according to the second embodiment. Except for the points described below, processes of FIG. 11 designated by the same reference symbols as those of FIG. 9 are identical with the processes described above with reference to FIG. 9. Therefore, no description will be made in this regard.

If the density of the charged particles falls within a predetermined range (YES at S105), the control unit 23 calculates the light emission intensity of the charged particles in the plasma, using the measurement result of the light emission intensity for every element received from the OES 40. Thereafter, the control unit 23 calculates a density of the charged particles corresponding to the calculated light emission intensity by referring to the second density table 213 stored in the database 21.

Subsequently, by referring to the first density table 211 stored in the database 21, the control unit 23 calculates a density of the charged particles corresponding to the measurement result of the change amount of the voltage received from the wall probe 30. Thereafter, using the aforementioned formula (4), the control unit 23 calculates a difference ΔD between a density $D_o$ of the charged particles calculated based on the measurement result of the OES 40 and a density $D_w$ of the charged particles calculated based on the measurement result of the wall probe 30. Subsequently, the control unit 23 determines whether the difference ΔD is smaller than a second threshold value (S200).

If the difference sD is smaller than the second threshold value (YES at S200), the processing device 50 performs the process of step S107. On the other hand, if the difference ΔD is equal to or larger than the second threshold value (NO at S200), the control unit 23 performs the process of step S114.

At step S108, the doping process performed by the processing device 50 is stopped and the measurement processes performed by the wall probe 30 and the OES 40 are stopped. Thereafter, during the doping process, the control unit 23 calculates an average value of the light emission intensities for every element of the dopant using the measurement result received from the OES 40. And, for every element of the dopant, the control unit 23 corrects the measurement result of the light emission intensity using the aforementioned formula (5) (S201).

Subsequently, for every element of the dopant, the control unit 23 calculates a dose amount corresponding to the corrected light emission intensity by referring to the dose amount table 210 stored in the database 21 (S202). Thereafter, the control unit 23 performs the process of step S110.

The second embodiment has been described above. According to the plasma processing apparatus according to the second embodiment, a measurement accuracy of the dose amount of the dopant including radicals can be improved in the plasma-based doping process.

[Hardware of Control Device 20]

Figure 12:
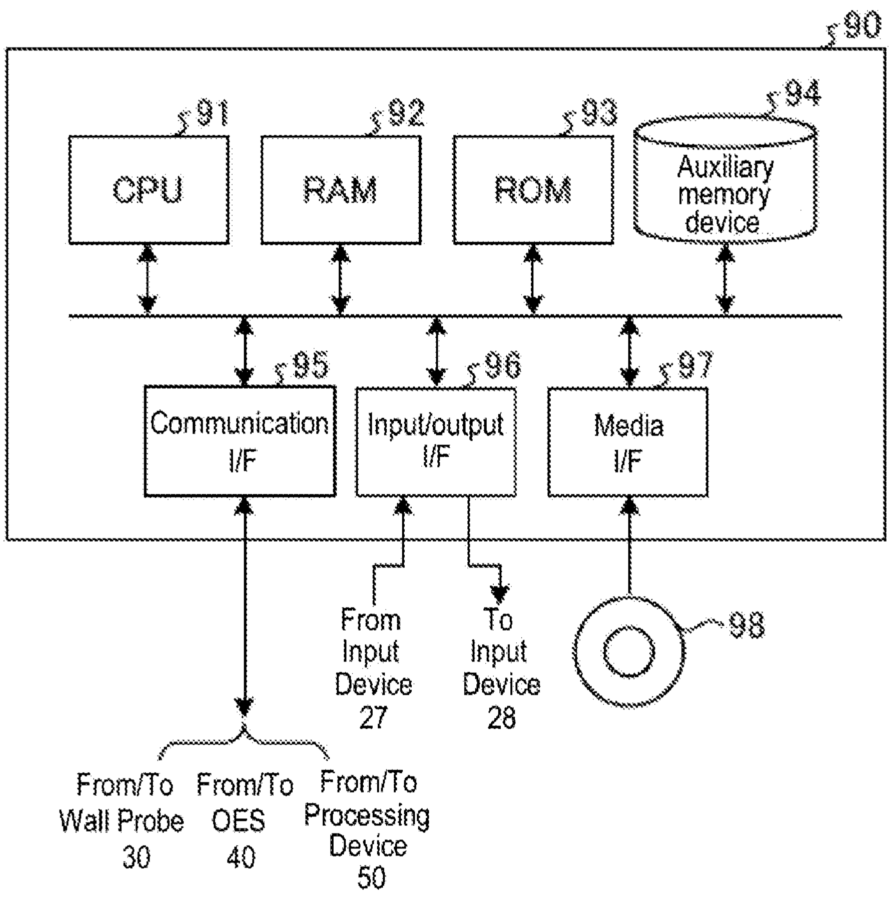
FIG. 12 is view showing one example of a computer which realizes functions of a control device.

The control device 20 according to the first embodiment or the second embodiment is realized by, e.g., a computer 90 shown in FIG. 12. FIG. 12 is view showing one example of the computer 90 which realizes the functions of the control device 20. For example, as shown in FIG. 12, the computer 90 includes a CPU (Central Processing Unit) 91, a RAM (Random Access Memory) 92, a ROM (Read Only Memory) 93, an auxiliary memory device 94, a communication interface (I/F) 95, an input/output interface (I/F) 96, and a media interface (I/F) 97.

The CPU 91 operates pursuant to a program stored in the ROM 93 or the auxiliary memory device 94 and controls the respective components or parts of the computer 90. The ROM 93 stores a boot program which is executed by the CPU 92 at the startup time of the computer 90, a program which depends on a hardware of the computer 90, and so forth.

The auxiliary memory device 94 is, e.g., a HDD (Hard Disk Drive) or a SSD (Solid State Drive), and is configured to store a program executed by the CPU 91 and data used by the program. The CPU 91 reads out the program from the auxiliary memory device 94 and loads the program on the RAM 92 to execute the loaded program. The communication I/F 95 receives data from the wall probe 30, the OES 40 and the processing device 50 via a communication line such as a LAN (Local Area Network) or the like, and sends the received data to the CPU 91. Further, the communication I/F 95 transmits the data generated by the CPU 91 to the wall probe 30, the OES 40 and the processing device 50 via the communication line.

The CPU 91 controls the input device 27 and the output device 28 through the input/output I/F 96. The CPU 91 acquires a signal inputted from the input device 27 through input/output I/F 96 and sends the same to the CPU 91. Further, the CPU 91 outputs the generated data to the output device 28 via the input/output I/F 96.

The media I/F 97 reads the program or the data stored in a recording medium 98 and stores the same in the auxiliary memory device 94. Examples of the recording medium 98 may include an optical recording medium such as a DVD (Digital Versatile Disk), a PD (Phase Change Rewritable Disk) or the like, a magneto-optical recording medium such as an MO (Magneto-Optical Disk) or the like, a tape medium, a magnetic recording medium, a semiconductor memory or the like.

The CPU 91 of the computer 90 executes the program loaded on the RAM 92 to realize the respective functions of the database 21, the parameter determination support unit 22 and the control unit 23. The data of the database 21 are stored in the ROM 93 or the auxiliary memory device 94.

The CPU 91 of the computer 90 reads the program to be loaded into the RAM 92 from the recording medium 98 and stores the program in the auxiliary memory device 94. As an alternative example, the CPU 91 of the computer 90 may acquire the program from other devices through the communication line and may store the acquired program in the auxiliary memory device 94.

The present disclosure is not limited to the aforementioned embodiments but may be differently modified without departing from the spirit thereof.

In the above embodiments, the control device 20 supports determination of different kinds of parameters in response to the manipulation of the operator. The processing device 50 performs the plasma-used doping process pursuant to the different kinds of parameters determined by the operator. The control device 20 calculates the dose amount of each of the wafers W based on the measurement results of the wall probe 30 and the OES 40. However, the present disclosure is not limited thereto. In some embodiments, the control device 20 may change values of the different kinds of parameters for the doping process according to the values determined by the operator such that a difference between the dose amount calculated based on the measurement results of the wall probe 30 and the OES 40 and the dose amount calculated based on the different kinds of parameters determined by the operator becomes smaller.

Further, in the above embodiments, the determination as to where the cleaning process is to be performed is made during the doping process. For that reason, when the cleaning process is performed, the doping process is stopped and the wafer W under processing is unloaded and wasted. However, the present disclosure is not limited thereto. In some embodiments, when the doping process is performed with respect to a specified number of wafers W or more, the control unit 23 may calculate a change amount of the measurement result of the OES 40 per one wafer W. Then, the control unit 23 may determine, prior to starting the doping process for a subsequent wafer W, whether the cleaning process will be performed during the doping process for the subsequent wafer W. Thus, if it is determined that the cleaning process will be performed during the doping process for the subsequent wafer W, the cleaning process can be performed prior to performing the doping process for the subsequent wafer W. This makes it possible to reduce the number of wafers W to be wasted.

According to different aspects and embodiments of the present disclosure, it is possible to measure a dose amount of a dopant including radicals in a plasma-based doping process.

While certain embodiments have been described, these embodiments have been presented by way of example only, and are not intended to limit the scope of the disclosures. Indeed, the embodiments described herein may be embodied in a variety of other forms. Further, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus, comprising:

a processing chamber into which a target substrate is loaded and in which a dopant is implanted into the target substrate using a plasma of a gas which contains an element used as the dopant;

a wall probe connected to an electrode installed inside the processing chamber to measure a change in voltage corresponding to a density of charged particles in the plasma generated within the processing chamber;

a window formed in a sidewall of the processing chamber;

an OES (Optical Emission Spectrometer) which receives light of the dopant existing in the plasma through the window to measure a light emission intensity of the dopant existing in the plasma; and a control device which receives a measurement result obtained at the wall probe and a measurement result obtained at the OES to calculate a dose amount of the dopant implanted into the target substrate and to determine whether to perform a cleaning process for cleaning the process chamber.

2. The apparatus of claim 1, wherein, if the density of charged particles corresponding to the change in voltage measured at the wall probe falls within a predetermined range, the control device calculates the dose amount using the measurement result obtained at the OES.

3. The apparatus of claim 1, wherein the control device instructs the cleaning process for cleaning the processing chamber if the density of the charged particles corresponding to the change in voltage measured at the wall probe falls within a predetermined range and if the light emission intensity of the dopant measured at the OES is smaller than a first threshold value.

4. The apparatus of claim 1, wherein the control device calculates the density of the charged particles in the plasma based on the light emission intensity measured at the OES for each type of particles included in the dopant existing in the plasma and instructs a cleaning process for cleaning the processing chamber if a difference between the calculated density of the charged particles and the density of the charged particles corresponding to the change in voltage measured at the wall probe is equal to or larger than a second threshold value.

5. The apparatus of claim 1, wherein the control device is configured to correct the measurement result obtained at the OES, using the measurement result obtained at the wall probe.

6. A measurement method, comprising:

implanting a dopant into a target substrate loaded into a processing chamber using a plasma of a gas which contains an element used as the dopant;

measuring, by a wall probe, a change in voltage corresponding to a density of charged particles in the plasma generated within the processing chamber;

receiving, by an OES (Optical Emission Spectrometer), light of the dopant existing in the plasma through a window formed in a sidewall of the processing chamber to measure a light emission intensity of the dopant existing in the plasma; and receiving, by a control device, a measurement result obtained at the wall probe and a measurement result obtained at the OES to calculate a dose amount of the dopant implanted into the target substrate and to determine whether to perform a cleaning process for cleaning the process chamber.

7. The measurement method of claim 6, further comprising:

correcting, by the control device, the measurement result obtained at the OES, using the measurement result obtained at the wall probe.

* * * * *